(12) United States Patent
Liu et al.

(10) Patent No.: US 9,007,803 B2
(45) Date of Patent: Apr. 14, 2015

(54) INTEGRATED CIRCUITS WITH PROGRAMMABLE ELECTRICAL CONNECTIONS AND METHODS FOR FABRICATING THE SAME

(71) Applicant: GLOBALFOUNDRIES, Inc., Grand Cayman (KY)

(72) Inventors: Yanxiang Liu, Wappingers Falls, NY (US); Min-hwa Chi, Malta, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 55 days.

(21) Appl. No.: 13/937,962

(22) Filed: Jul. 9, 2013

(65) Prior Publication Data

US 2015/0016174 A1   Jan. 15, 2015

(51) Int. Cl.
*G11C 17/00* (2006.01)
*H01L 27/112* (2006.01)
*H01L 21/768* (2006.01)
*G11C 17/16* (2006.01)

(52) U.S. Cl.
CPC ........ *H01L 27/11206* (2013.01); *H01L 21/768* (2013.01); *G11C 17/16* (2013.01)

(58) Field of Classification Search
USPC ............... 365/96, 51, 63, 225.7; 257/50, 530, 257/E23.147
See application file for complete search history.

(56) References Cited

U.S. PATENT DOCUMENTS 6,590,797 B1 * 7/2003 Nachumovsky et al. ....... 365/96
8,229,570 B2   7/2012 Nygren et al.

* cited by examiner

*Primary Examiner* — David Lam
(74) *Attorney, Agent, or Firm* — Ingrassia Fisher & Lorenz, P.C.

(57) ABSTRACT

Methods and apparatus are provided for an integrated circuit with a programmable electrical connection. The apparatus includes an inactive area with a memory line passing over the inactive area. The memory line includes a programmable layer. An interlayer dielectric is positioned over the memory line and the inactive area, and an extending member extends through the interlayer dielectric. The extending member is electrically connected to the programmable layer of the memory line at a point above the inactive area.

14 Claims, 9 Drawing Sheets

INTEGRATED CIRCUITS WITH PROGRAMMABLE ELECTRICAL CONNECTIONS AND METHODS FOR FABRICATING THE SAME

TECHNICAL FIELD

The technical field generally relates to integrated circuits and methods for fabricating integrated circuits, and more particularly relates to integrated circuits with programmable electrical connections and methods for fabricating the same.

BACKGROUND

Integrated circuits are used for a wide variety of purposes in the semiconductor industry, and many different electrical components of integrated circuits are combined or utilized for various applications. For example, integrated circuits are used for several different types of memory systems. Many memory systems in microelectronics use an array to select a specific memory cell to read. The memory array may include a plurality of bitlines and a plurality of wordlines, where each bitline intersects each wordline, and the memory cell is located at the intersection point. The information stored in memory can be accessed by reading the state of the memory cell at a selected bitline and wordline. For example, a simple grid may have 8 bitlines and 8 wordlines, for a total of 64 memory cells. Each individual memory cell may be designated and selected by activating the associated bitline and wordline.

The memory cell located at a bitline and wordline intersection may have two different states, which represent a zero (0) or a one (1) in a binary number system. The integrated circuit may be configured to recognize the different states of cells, and associate the two different states with either a 0 or a 1. Therefore, an integrated circuit may use a wide variety of different types of memory cells including: circuits which are open or closed; capacitors which are charged or uncharged; variable resistors which have a high resistance or a low resistance; etc.

A programmable electrical connection is an electrical connection that can be set or changed between two or more different states. In some embodiments, the electrical connection may include a fuse or anti-fuse, where the electrical connection is either effectively complete (short) or broken (open) depending on the state of the fuse or anti-fuse. In other embodiments, the electrical connection includes a programmable layer with a variable resistance, so the electrical connection functions as a variable resistor.

Certain materials may be configured or used as anti-fuses, where essentially no current is allowed to flow (i.e. "open" state) until a programming voltage is applied to set the anti-fuse to be conductive. Some materials or structures may be configured to change between a low and high resistance state, where the resistance state is changed by applying a set or reset voltage. For example, hafnium oxide can be reliably changed between different resistance states. These "programmable" materials may be used as components of a memory cell, or for other purposes as well, such as controlling current to selected components. The creation of a fuse or anti-fuse typically requires the deposition of several layers with different compositions, and each layer typically requires at least one additional manufacturing step, such as removal of excess materials, application of photoresist layers, etc.

There is market pressure to reduce the size, cost, and power consumption of integrated circuits while increasing the speed of operation and the reliability of the components. Many integrated circuits are used for memory purposes, so the market pressures also apply to integrated circuits used for memory. Processes and methods that eliminate manufacturing steps by utilizing existing structures can lower cost and may reduce the size of various components. There is also pressure to increase the availability of small, low cost, fast memory that is non-volatile on chip, which means the integrated circuit retains the saved memory cell states when powered down.

Accordingly, it is desirable to develop new programmable electrical connections for use in integrated circuits that reduce size and cost while being reliable. In addition, it is desirable to develop methods and systems for incorporating programmable electrical connections into memory cells for improved non-volatile performance. Furthermore, other desirable features and characteristics of the present embodiment will become apparent from the subsequent detailed description and the appended claims, taken in conjunction with the accompanying drawings and this background.

BRIEF SUMMARY

A method is provided for fabricating an integrated circuit with a programmable electrical connection. The method comprises providing a memory line with a bottom side, a left side, and a right side, wherein the memory line further comprises a metal core, a memory line barrier layer, and a programmable layer. The programmable layer is positioned along the bottom side, the left side, and the right side, and the memory line barrier layer is positioned between the metal core and the programmable layer. Sidewall spacers are provided, wherein the sidewall spacers abut the left and right sides, and the memory line extends over an inactive area of the integrated circuit. An interlayer dielectric is formed overlying the memory line, the sidewall spacers, and the inactive area, and a via is etched through the interlayer dielectric to one of the sidewall spacers at a position over the inactive area and adjacent to the memory line. The sidewall spacer is etched through the via, and an extending member is formed within the via such that the extending member is electrically connected to the programmable layer of the memory line.

An apparatus is provided for an integrated circuit with a programmable electrical connection. The apparatus comprises an inactive area with a memory line passing over the inactive area. The memory line comprises a programmable layer. An interlayer dielectric is positioned over the memory line and the inactive area, and an extending member extends through the interlayer dielectric. The extending member is electrically connected to the programmable layer of the memory line at a point above the inactive area.

In another embodiment, an apparatus is provided for an integrated circuit with a programmable electrical connection. The apparatus comprises a memory line with a left and right side, where the left and right sides comprise a programmable layer. An interlayer dielectric is positioned over the memory line and the inactive area, and an extending member extends through the interlayer dielectric to a position adjacent to the memory line. The extending member forms an electrical connection with the programmable layer at one of the left or right sides

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the application and uses of the embodiment described. Furthermore, there is no intention to be bound by any theory presented in the preceding background or the following detailed description.

Integrated circuits with programmable electrical connections are described herein. For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based integrated circuits are well known and so, in the interest of brevity, many conventional steps will only be mentioned briefly herein or will be omitted entirely without providing the well-known process details.

A programmable electrical connection in a memory cell is an electrical connection through a material that changes between different states. The programmable electrical connection is formed between a memory line and an extending member, where the resistance of the programmable electrical connection can be changed between a high and low resistance state. Various embodiments contemplated herein include a memory line formed with a programmable layer on the bottom and sides, but not on the top, where the programmable layer can change between a high and low resistance state. An extending member contacts the left or right side of the memory line, so the programmable electrical connection utilizes the existing programmable layer of the memory line and there is no need to manufacture a new programmable layer. This avoids the additional manufacturing steps and associated costs for creating a new programmable layer. The memory line is formed at least partially over an inactive layer, and the extending member is also formed over the inactive area, so there is little concern with mis-alignment causing an unintended short. The memory line and extending member can then be incorporated into a memory cell, or used for other purposes.

Figure 1:
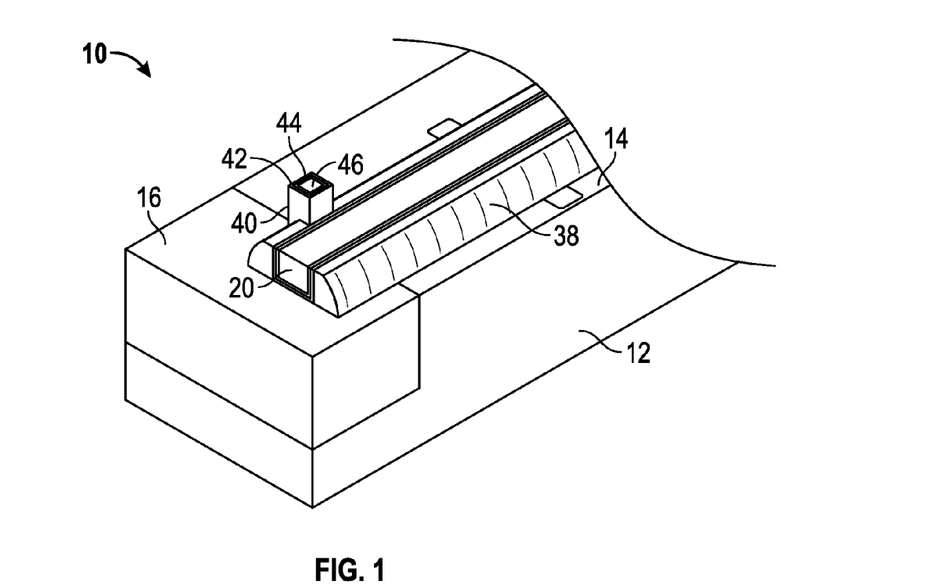
FIG. 1 is a perspective view of an embodiment of a portion of an integrated circuit with a memory line and a extending member on a substrate, where the memory line is partially positioned over an inactive area, and partially positioned over an active area.
Figure 2:
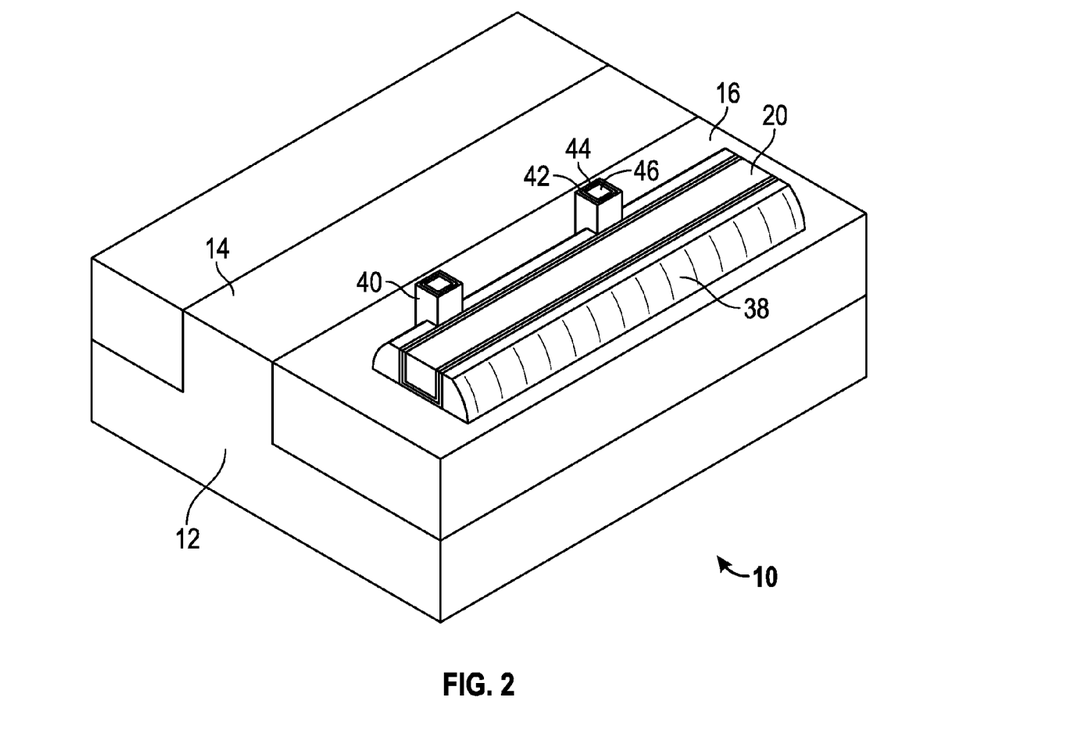
FIG. 2 is a perspective view of another embodiment of a portion of an integrated circuit with a memory line and a plurality of extending members on a substrate, where the memory line is entirely positioned over an inactive area.

Referring now to FIGS. 1 and 2, a portion of an integrated circuit 10 includes a substrate 12 that has an active area 14 and an inactive area 16. The substrate 12 may be a semiconductor, such as a crystalline silicon wafer or a silicon on insulator (SOI) substrate. The active area 14 may have exposed crystalline silicon and various electronic devices, and the inactive area 16 may be an insulator, such as silicon oxide or silicon nitride. The inactive area 16 may be a shallow trench isolation area (STI), and the insulator in the inactive area 16 can be referred to as the inactive area insulator.

A memory line 20 is positioned on the integrated circuit such that at least a portion of the memory line 20 is over the inactive area 16. In different embodiments, the memory line 20 may or may not extend over the active area 14. In some embodiments, the memory line 20 also serves as a gate for a planar and/or three dimensional transistor in the active area 14. In other embodiments, the memory line 20 does not serve as a component of other electronic devices.

Figure 3:
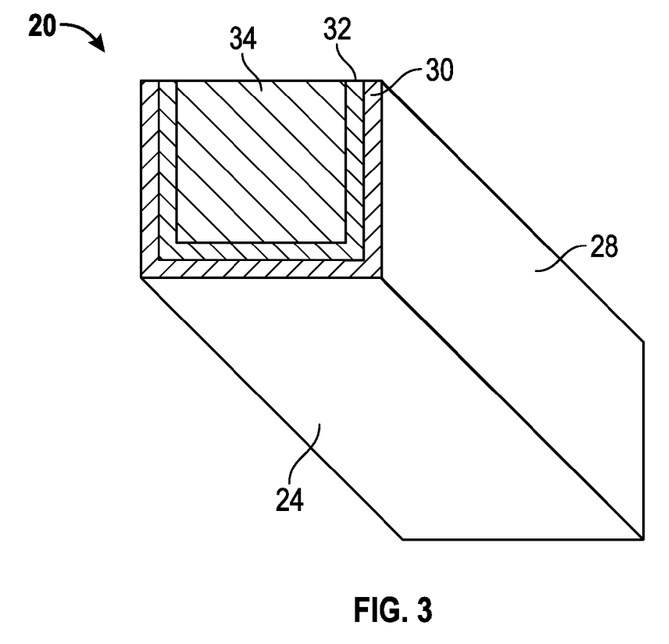
FIG. 3 is a lower right perspective view of one embodiment of the memory line of FIGS. 1 and 2.
Figure 4:
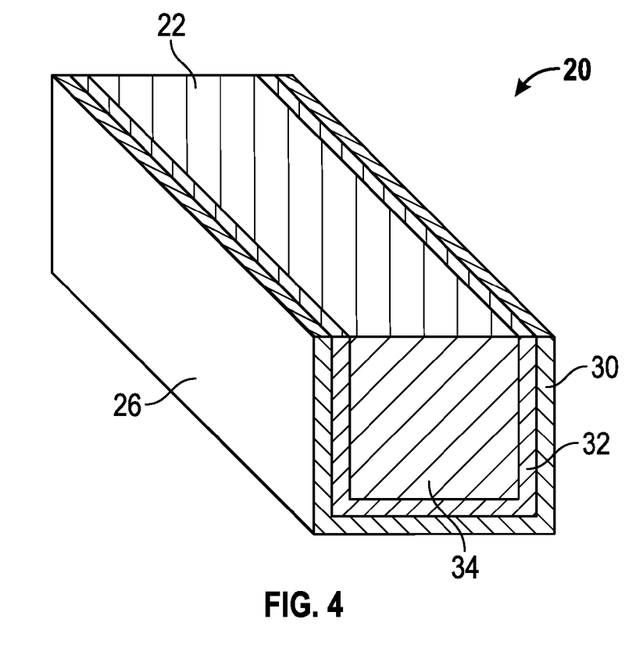
FIG. 4 is an upper left perspective view of one embodiment of the memory line of FIGS. 1 and 2.

Reference is now made to FIGS. 3 and 4, with continuing reference to FIGS. 1 and 2. As depicted in the figures, the memory line 20 has a top side 22 and a bottom side 24, as well as a left side 26 and a right side 28. The memory line 20 includes a programmable layer 30 that forms the outer surface on the bottom, left, and right sides 24, 26, 28, but in many embodiments the programmable layer 30 does not form the top side 22. The programmable layer 30 is made from a material capable of switching between a high and low resistance state. For example, the programmable layer 30 may comprise $HfO_2$, and in some embodiments the programmable layer 30 is at least 90 percent $HfO_2$ by weight based on the total weight of the programmable layer 30. However, in other embodiments, the programmable layer 30 comprises zirconium dioxide ($ZrO_2$), hafnium zirconium oxide ($Hf_xZr_{(1-x)}O_2$), tantalum oxide ($TaO_2$), or other materials. As with $HfO_2$, the proportional ratio of oxygen may vary in the compounds of the programmable layer 30.

Some materials have the ability to change resistance under prescribed conditions. One such material is hafnium oxide ($HfO_2$), which has been shown to have resistance switching properties. Theories have been presented for why $HfO_2$ switches resistances. For instance, when a thin layer of $HfO_2$ is sandwiched between two metal layers, the resistance switching may be due to the formation of conductive paths associated with oxygen vacancies within the $HfO_2$, where the "set" and "reset" voltage is applied to trigger oxygen migration to fill or form the oxygen vacancies. Therefore, $HfO_2$ can be thought of as $HfO_x$, because the proportional ratio of oxygen to hafnium may vary, with similar effects for other possible programmable layer materials. Alternatively, an $HfO_2$ layer may be sandwiched between a metal oxide layer and a capping layer, where the capping layer is a metal capable of reducing the $HfO_2$ (such as hafnium or titanium). Conductive paths or filaments are theorized to form due to oxygen deficient areas in the $HfO_2$, and these filaments are formed or removed with a "set" or "reset" voltage. This disclosure does not espouse any specific theory or explanation for the phenomenon, but it is known that thin layers of $HfO_2$ can switch between high and low resistive states when a sufficient voltage (or current) is applied. The $HfO_2$ may have a programming voltage to initiate the resistance switching states, and in some embodiments a lower voltage can then be used to set or reset the $HfO_2$. A reading voltage even lower than the set/reset voltage can then be used to read the resistive state of the $HfO_2$. The set/reset voltage may be of opposite polarity in some embodiments.

The memory line 20 also has a memory line barrier layer 32 overlying the programmable layer 30, so the memory line barrier layer 32 makes a "U" shape just inside the programmable layer 30 along the left, bottom, and right sides 26, 24, 28. As used herein, "overlying" means "on" (such that the memory line barrier layer 32 physically contacts the programmable layer 30), or "over" (such that another material layer, such as another programmable layer, may lie in between the memory line barrier layer 32 and the programmable layer 30). The memory line barrier layer 32 may facilitate the programmable layer 30 in switching between the high and low resistance states. For example, a titanium nitride memory line barrier layer 32 is more thermally stable and inert than some other materials, and can help prevent diffusion between the programmable layer 30 and the metal core 34. The materials contacting the programmable layer 30 may impact how the programmable layer 30 operates, such as the size of the voltages needed, the polarity of the voltages needed, etc. In one embodiment, the memory line barrier layer 32 comprises titanium nitride (TiN), and in some embodiments the memory line barrier layer 32 is at least 90 percent titanium nitride based on the total weight of the memory line barrier layer 32. However, in other embodiments the memory line barrier layer 32 is tantalum nitride (TaN), a metal, an alloy, another metal nitride or metal oxide, or other materials.

The memory line 20 has a metal core 34 overlying the memory line barrier layer 32, so the memory line barrier layer 32 is between the programmable layer 30 and the metal core 34. In some embodiments, the metal core 34 forms the largest portion of the memory line 20. In some embodiments, the metal core 34 includes a refractory metal, such as tungsten (W), molybdenum (Mo), nickel silicide (NiSi), cobalt silicide (CoSi), and various alloys or intermetallics. In other embodiments, the metal core 34 comprises non-refractory metals, such as aluminum (Al), titanium aluminide (TiAl), cobalt (Co), titanium (Ti), and various alloys and intermetallics.

In an embodiment, sidewall spacers 38 are positioned along the left and right sides 26, 28 of the memory line 20 such that the sidewall spacers 38 abut the left and right sides 26, 28. The sidewall spacers 38 extend from the inactive area 16 of the substrate 12 (or the intersection of the bottom side 24 and the left side 26 or the right side 28) to about the top of the left and right sides 26, 28. The sidewall spacers 38 are silicon nitride in some embodiments, but other insulating materials may also be used.

An extending member 40 extends upward from the inactive layer 16 to beyond the top side 22 of the memory line 20. The extending member 40 is in physical contact with one of the left or right side 26, 28 of the memory line 20 such that there is an electrical connection between the extending member 40 and the memory line 20. In this regard, the extending member 40 is in electrical communication with the programmable layer 30 of the memory line 20. In an embodiment, the extending member 40 extends through the sidewall spacers 38 to form the electrical connection with the memory line 20. The extending member 40 is electrically connected to the memory line 20 through the programmable layer 30, and, as discussed above, the programmable layer 30 is made of a material that can be changed between high and low resistance states. Therefore, the resistance of the electrical connection can be set and then read even if power to the integrated circuit 10 is lost. In this regard, the electrical connection is used as a non-volatile memory element.

In an exemplary embodiment, the extending member 40 has several layers, including an adhesion layer 42 along the outer side surfaces, an extending member barrier layer 44 inside of the adhesion layer 42, and a plug 46 inside of the extending member barrier layer 44. The plug 46 forms the center portion of the extending member 40, so the extending member barrier layer 44 is positioned between the adhesion layer 42 and the plug 46. Materials suitable for the plug 46 include conductive metals such as tungsten (W), but other metals, alloys, intermetallics, or conductive materials may also be used. The adhesion layer 42 facilitates good electrical contact of the extending member 40 with the memory line 20. In some embodiments, the adhesion layer 42 facilitates oxygen vacancy formation and resistance switching of the programmable layer 30. In this regard, the adhesion layer 42 directly contacts the programmable layer 30 on the left or right side 26, 28 of the memory line. The extending member barrier layer 44 prevents the material of the plug 46 from diffusing into or through the adhesion layer 42, and also serves as an adhesion or seed layer for the plug 46. Titanium and titanium nitride are non-limiting examples of suitable materials for the adhesion layer 42 and the extending member barrier layer 44.

Many integrated circuits 10 have several layers (not shown), and in some embodiments the extending member 40 is electrically connected to other structures on a higher layer than the memory line 20. In one embodiment, the memory line 20 and extending member 40 may be used as part of a memory cell, as will be further described below, but other uses are also possible. The memory line 20 has a programmable layer 30 on the left and right sides 26, 28, and the extending member 40 forms an electrical contact with the left or right side 26, 28, so there is no need to form a new programmable layer 30 between the memory line 20 and the extending member 40 at the process step where the electrical connection is made.

In some embodiments, the memory line 20 can serve as a transistor gate over an active area 14 of the integrated circuit 10, and the HfO$_2$ on the bottom side 24 of the memory line 20 can serve as the gate insulator. HfO$_2$ has a high dielectric constant, and may be used as a gate insulator for transistors, including transistors with refractory metal gates. Manufacturing steps can be eliminated by utilizing HfO$_2$ already positioned on the left and right sides 26, 28 of the memory line 20, because no new steps are required to deposit the programmable layer 30 and/or the memory line barrier layer 32 to produce a programmable electrical connection. This is especially true in embodiments where the memory line 20 also serves as a transistor gate in an active area 14. HfO$_2$ reliably changes between high and low resistive states, and requires relatively low power when used in a programmable electrical connection. The embodiments described above provide reliable, low cost programmable electrical connections that require relatively low power to operate.

Many transistors have electrical connection(s) with a source and/or drain, and the source and drain are typically formed aligned to the sides of the gate. Therefore, an electrical connection along the side of a transistor gate may also make an electrical connection with either the source or drain, which would short out the transistor. However, the extending member 40 is positioned over the inactive area 16, so there is little risk of the extending member 40 creating a short with an electronic component within the active area 14 of the substrate. The gate of a transistor can extend beyond the source and drain in the active area 14 and still function properly. Programmable electrical connections over the inactive area 14 can reduce the size of the integrated circuit because the inactive areas 14 are often only used to separate or isolate different electronic components. The cost to modify transistor gate manufacturing steps to extend the gate over an inactive area 16 are relatively low, so the embodiments described above provide a reliable, low cost method of producing programmable electrical connections.

Figure 5:
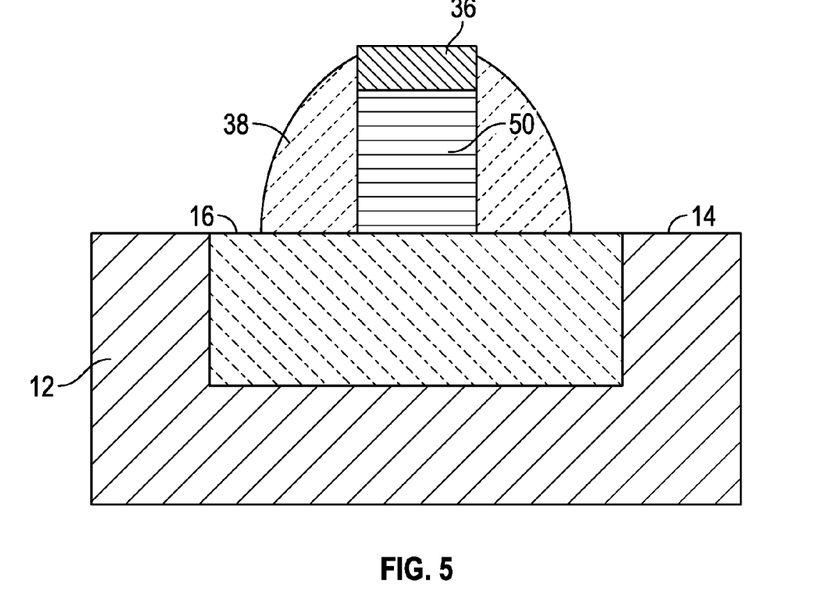
FIGS. 5-13 illustrate in cross sectional views a method of manufacture of the integrated circuit of FIG. 1.

In an exemplary embodiment, a method for forming an integrated circuit having a programmable electrical connection is described with reference to FIGS. 5-13, with continuing reference to FIGS. 1-4. FIG. 5 shows a substrate 12 with an inactive area 16 and an active area 14. A dummy gate 50 is positioned between sidewall spacers 38, where the dummy gate 50 may be polycrystalline silicon, and the sidewall spacers 38 may be silicon nitride. The dummy gate 50 is formed by depositing a layer of gate forming material, such as polycrystalline silicon. Polycrystalline silicon can be deposited using low pressure chemical vapor deposition. A layer of silicon nitride is deposited on top of the polycrystalline silicon, followed by a layer of photoresist. The photoresist is patterned, and the silicon nitride is etched to leave a hard mask 36 on top of the polycrystalline silicon that will become the dummy gate 50. The polycrystalline silicon is then anisotropically etched to form the dummy gate 50 with a hard mask 36 on top. Another layer of silicon nitride is conformally deposited over the substrate 12, hard mask 36, and the dummy gate 50, and is anisotropically etched to form the sidewall spacers 38 on the sidewalls of the dummy gate 50. The silicon nitride from the hard mask 36 remains on top of the dummy gate 50.

Figure 6:
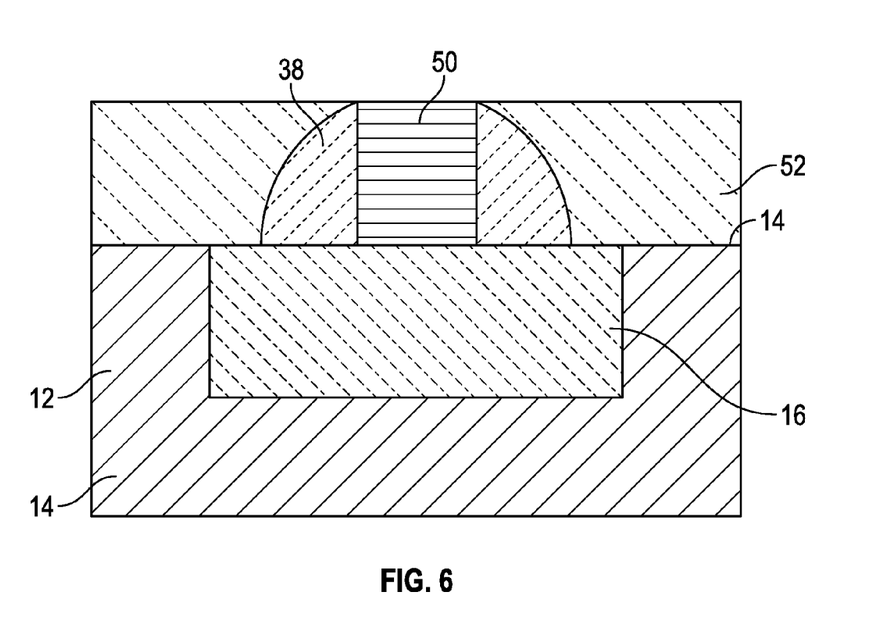
Figure 7:
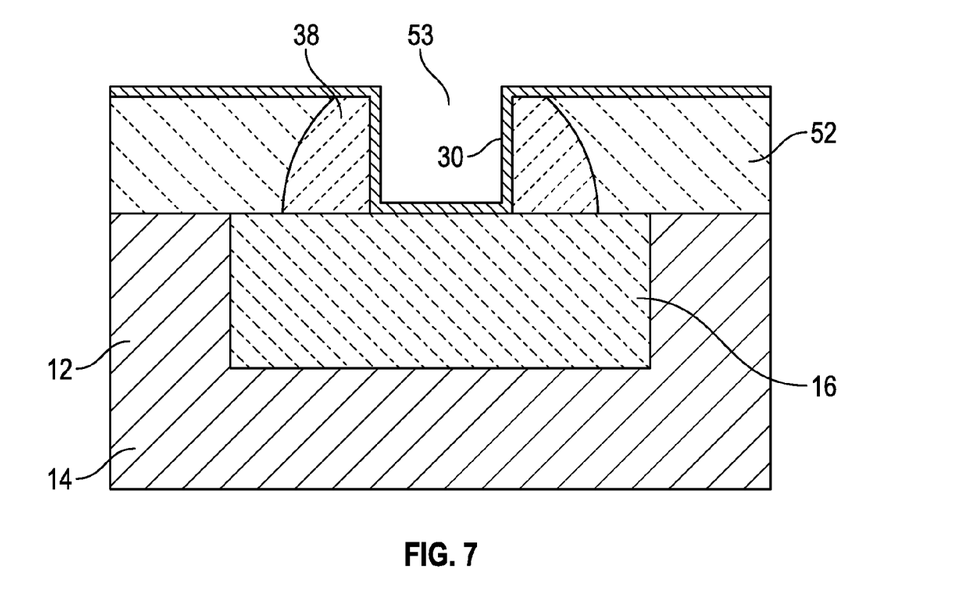

Referring to FIG. 6, in an embodiment, an interlayer dielectric 52 is deposited over the dummy gate 50. The interlayer dielectric 52 is formed, for example, from silicon dioxide. A portion of the interlayer dielectric 52 is then removed, such as by chemical mechanical planarization, to expose the dummy gate 50 and the top portion of the sidewall spacers 38. As illustrated in FIG. 7, the polycrystalline silicon dummy gate 50 is selectively etched from within the sidewall spacers 38 to expose the inactive area 16 and form a trench 53. The dummy gate 50 can be selectively etched, for example, with reactive ion etching and a wet etch using ammonium hydroxide or tetramethyl ammonium hydroxide. A programmable layer 30 is conformally deposited within the trench 53 overlying the inactive area 16 and the sidewall spacers 38. If the programmable layer 30 is $HfO_2$, the $HfO_2$ can be deposited by atomic layer deposition.

Figure 8:
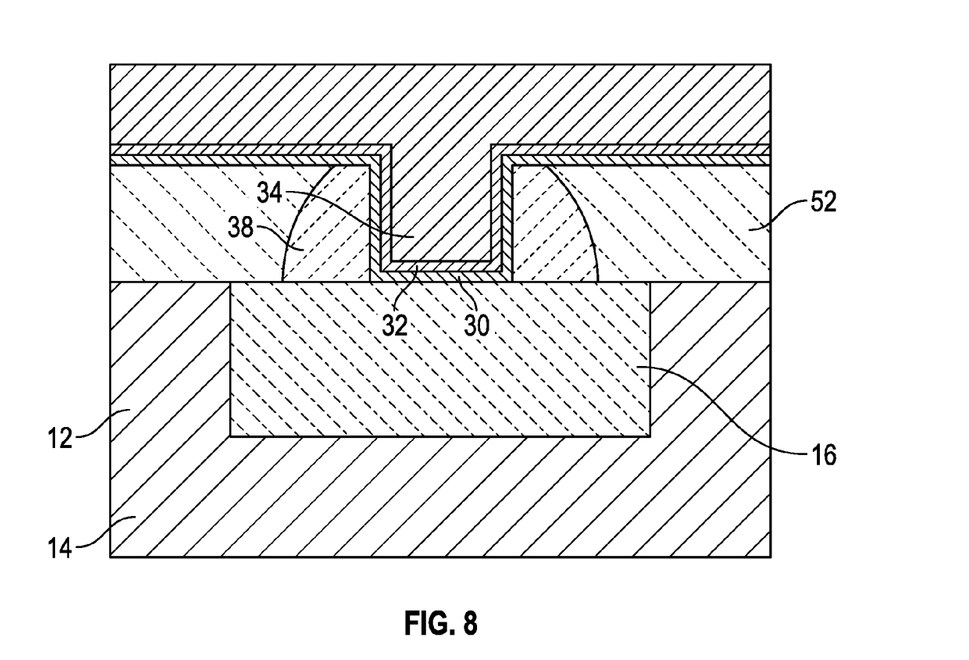
Figure 9:
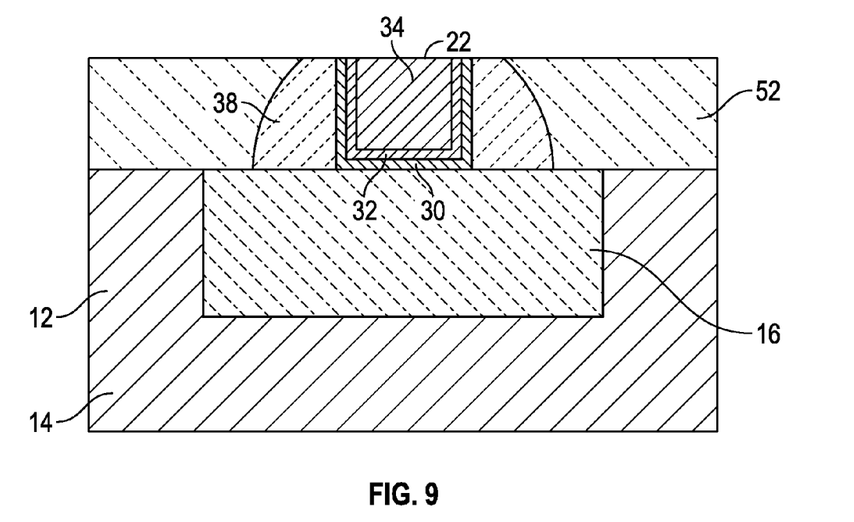

A memory line barrier layer 32 is deposited over the programmable layer 30, as illustrated in FIG. 8. If the memory line barrier layer 32 is titanium nitride, the titanium nitride layer may also be deposited by atomic layer deposition. After deposition of the memory line barrier layer 32, a metal core 34 is deposited overlying the memory line barrier layer 32. If the metal core 34 is tungsten, the tungsten can be deposited by physical vapor deposition or chemical vapor deposition. The portions of the programmable layer 30, the memory line barrier layer 32, and the metal core 34 above the sidewall spacers 38 are then removed, such as by chemical mechanical planarization, as illustrated in FIG. 9.

Figure 10:
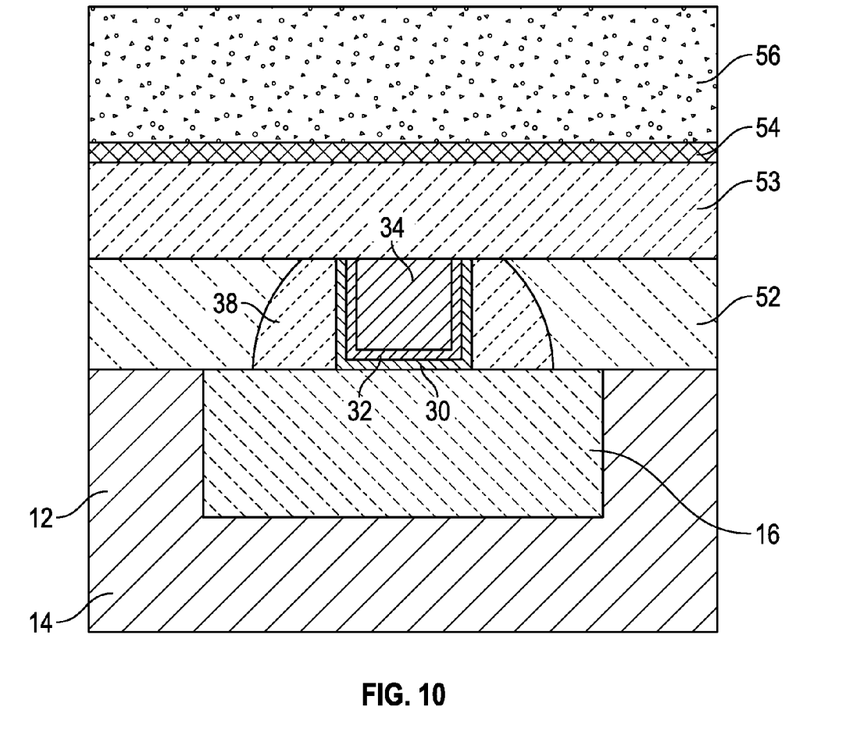

Referring now to FIG. 10, an additional interlayer dielectric 53 is deposited over the metal core 34, the memory line barrier layer 32, the programmable layer 30, and the sidewall spacers 38. The additional interlayer dielectric 53 expands and extends the interlayer dielectric 52 previously in place. In some embodiments, the additional interlayer dielectric 53 is silicon dioxide, which can be deposited by chemical vapor deposition. A layer of hard mask 54, such as titanium nitride or other materials, is then deposited on top of the interlayer dielectric 52. Atomic layer deposition can be used to deposit the hard mask 54 if the hard mask is titanium nitride.

Figure 11:
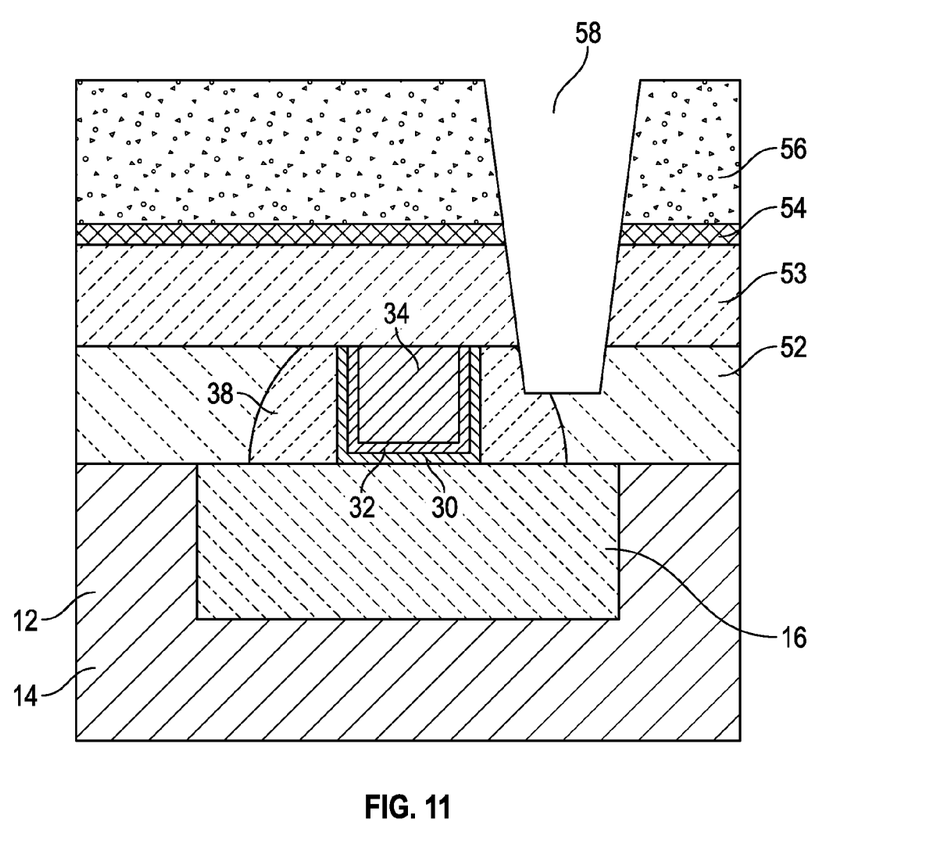
Figure 12:
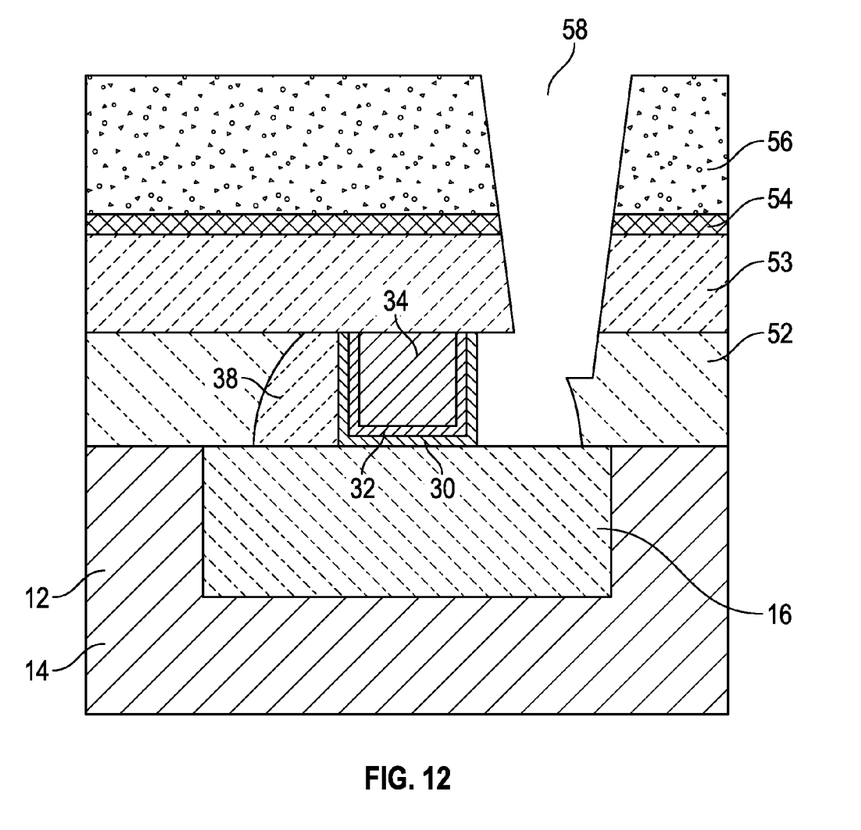

In an embodiment, a via photoresist layer 56 is then applied overlying the hard mask 54. The via photoresist layer 56 is patterned and a via 58 is etched through the hard mask 54 and interlayer dielectrics 52, 53 as illustrated in FIG. 11. The via 58 is etched to the sidewall spacer 38 adjacent to either the left or right side 26, 28 of the memory line 20. The via 58 may be etched a short distance into the sidewall spacer 38 in some embodiments. Referring now to FIG. 12, the sidewall spacer 38 is removed from one of the left or right side 26, 28 of the memory line 20. A portion of the sidewall spacer 38 is etched through the via 58 using an etchant selective for the material of the sidewall spacer 38. The programmable layer 30 and the interlayer dielectrics 52, 53 remain in place when the sidewall spacer 38 is etched. For example, if the sidewall spacer 38 is silicon nitride, hot phosphoric acid can be used as the etchant.

Figure 13:
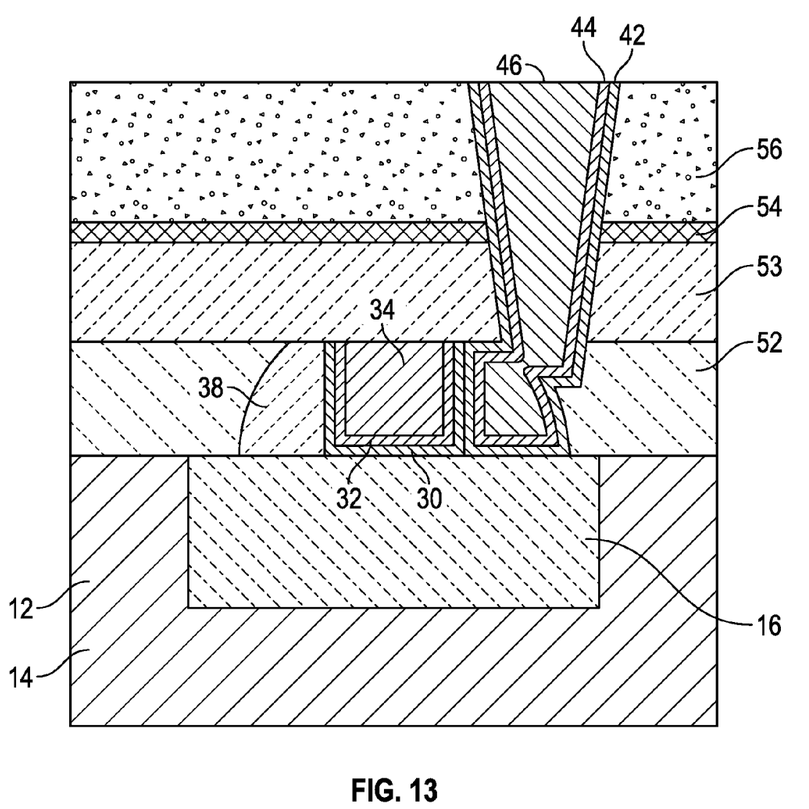

The extending member 40 is deposited within the via 58, as illustrated in FIG. 13. In an embodiment, the extending member 40 is formed by sequentially depositing the adhesion layer 42, the extending member barrier layer 44, and the plug 46. For example, if the adhesion layer 42 is titanium, the extending member barrier layer 44 is titanium nitride, and the plug 46 is tungsten, the extending member 40 may be formed by chemical vapor deposition, atomic layer deposition, and chemical vapor deposition reaction of tungsten hexafluoride and hydrogen, respectively.

A different electronic component (not shown) can then be electrically connected to the memory line 20 (which includes the programmable layer 30, the memory line barrier layer 32, and the metal core 34) through the extending member 40 (which includes the adhesion layer 42, the extending member barrier layer 44, and the plug 46). The different electronic component is electrically contacted to the extending member 40 on top of the additional interlayer dielectric 53 upon removing the via photoresist layer 56 and hard mask 54 and the portion of the extending member 40 that extends therethrough. The programmable layer 30 is positioned between the metal core 34 of the memory line 20 and the extending member 40, so the resistance between the memory line 20 and the plug 46 can be programmed at either a high or low state. In some embodiments, the $HfO_2$ of the programmable layer 30 can also serve as a gate insulator, so the memory line 20 can serve as a gate for transistors in the active area 14. The foregoing manufacturing process is one example of how to provide a memory line 20 and an extending member 40, but other methods are possible, and the materials described could be modified in various embodiments.

In some embodiments, the active area 14 may include transistors using self aligned contacts, where silicon nitride or another insulator is positioned on top of the gate prior to forming contacts from higher dielectric or metal levels of the integrated circuit. If the sidewall spacers 38 are formed from silicon nitride, the silicon nitride selective etchant would remove the silicon nitride from the top side 22 of the memory line 20 (which is where the metal core 34 is shown directly contacting the interlayer dielectric 52) while removing the sidewall spacers 38. If the top side 22 of the memory line 20 does not have a programmable layer 30, an electrical connection between the extending member 40 and the top side 22 would by-pass the programmable layer 30. In one embodiment, a mask could be used to protect selected locations during creation of the self aligned structures such that no silicon nitride is deposited on the top side 22 top of the memory line 20. The programmable electrical connection can then be formed using the methods described above.

Figure 14:
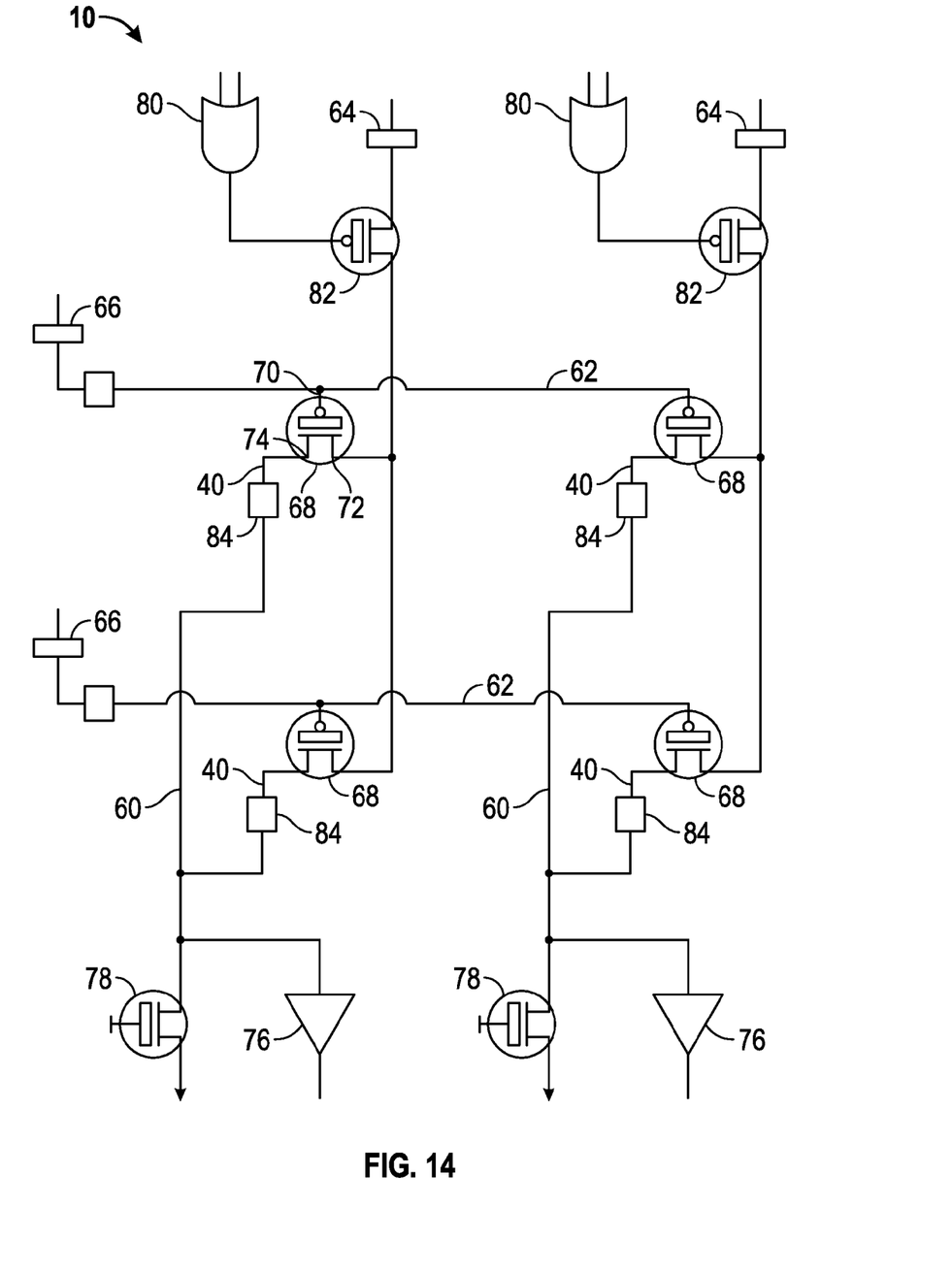
FIG. 14 depicts an electrical diagram of one embodiment of an integrated circuit used for memory.

Reference is now made to FIG. 14, which shows one embodiment of an integrated circuit 10 for memory. The integrated circuit 10 has a plurality of bitlines 60 and a plurality of wordlines 62 forming a grid. A two by two grid is shown, but many other sizes are possible. In one embodiment, a bitline voltage supply 64 corresponds to each bitline 60, and a wordline signal 66 corresponds to each wordline 62. An access transistor 68 is positioned at the intersection of the bitlines 60 and the wordlines 62. The access transistor 68 has an access transistor gate 70 electrically connected to the wordline 62, a power inlet 72 electrically connected to the bitline voltage supply 64, and an output to memory cell 74 electrically connected to the extending member 40. The access transistor 68 is a thick oxide PFET, so it can manage high voltages for programming. In FIG. 14, the programmable electrical connection described above and shown in FIGS. 1 and 2 is located in the box 84 below the extending member 40. The memory line 20 may serve as the bitline 60 in the embodiment shown. The bitline 60 is electrically connected to a sense amplifier 76 and a program/sense selector 78. The program/sense selector 78 includes a thick oxide NFET to manage the high programming voltage. A bitline enable signal 80 may be electrically connected to a bitline enable transistor 82, where the bitline enable transistor 82 is positioned in the line from the bitline voltage supply 64 to the power inlet 72 of the access transistor 68. The bitline enable transistor 82 is a thick oxide PFET to deliver high programming voltages.

The access transistor 68, the extending member 40, and the electrical contact of the extending member 40 with the memory line 20 serve as a memory cell at the intersection of a bitline 60 and a wordline 62. The memory cell can be a one time programmable anti-fuse, where a programming voltage is applied to alter the programmable layer 30, and thus the memory cell, from a low resistance state to a high resistance state. The memory cell is then read by applying a read voltage, which is lower than the programming voltage, to determine the resistance state of the memory cell. Alternatively, the memory cell can be a resistive random access memory cell (RRAM) or other resistive memory cell, where the memory cell can be set and reset between a high and low resistance state. In the resistive memory cell, a set or reset voltage is applied to switch the memory cell between a high and a low resistance state. The set and reset voltages may have opposite polarities in some embodiments. A lower read voltage can then be applied to the memory cell to determine which resistive state the memory cell is in.

The memory cell is changed between different resistance states by applying a high voltage, which means a voltage higher than the "read voltage," from the bitline voltage supply 64 through the memory cell to the program/sense selector 78. This may be done by activating the program/sense selector 78 and the access transistor 68 at the same time, so a programming voltage from the bitline voltage supply 64 is provided to the power inlet 72, and current flows through the access transistor 68 and changes the resistive state of the electrical connection between the extending member 40 and the memory line 20. The memory cell is read by applying the lower read voltage from the bitline voltage supply 64 through the memory cell to the sense amplifier 76. The integrated circuit 10 is configured to apply the appropriate bitline voltage supply 64 and wordline signal 66 for any selected memory cell in the grid, where activation of the wordline signal 66 opens the access transistor 68.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit with a programmable electrical connection comprising:
   an inactive area;
   a memory line overlying the inactive area, wherein the memory line comprises a programmable layer;
   an interlayer dielectric positioned over the memory line and the inactive area;
   an extending member extending through the interlayer dielectric, wherein the extending member is electrically connected to the memory line at a point above the inactive area, and wherein the extending member is electrically connected to the programmable layer of the memory line.

2. The integrated circuit of claim 1 wherein the memory line further comprises a bottom side, a left side, a right side, a metal core and a barrier layer, wherein the barrier layer is positioned between the metal core and the programmable layer on the bottom side, the left side and the right side; and
   wherein the extending member is electrically connected to the programmable layer of the memory line at one of the left or right side.

3. The integrated circuit of claim 2 further comprising sidewall spacers abutting the left side and the right side, wherein the sidewall spacers comprise silicon nitride, and wherein the extending member extends through the sidewall spacers to form the programmable electrical connection with the memory line.

4. The integrated circuit of claim 1 further comprising:
   a sense amplifier; and
   a program/sense selector;
   wherein the memory line is electrically connected to the sense amplifier and the program/sense selector.

5. The integrated circuit of claim 4 further comprising:
   a wordline;
   a bitline voltage supply; and
   an access transistor, wherein the access transistor comprises an access transistor gate, a power input, and an output to memory cell; and
   wherein the access transistor gate is electrically connected to the wordline, the power input is electrically connected to the bitline voltage supply, and the output to memory cell is electrically connected to the extending member.

6. The integrated circuit of claim 1 wherein:
   the extending member comprises an adhesion layer, an extending member barrier layer, and a plug;
   wherein the extending member barrier layer is positioned between the plug and the adhesion layer; and
   wherein the adhesion layer comprises titanium, the extending member barrier layer comprises titanium nitride, and the plug comprises tungsten.

7. The integrated circuit of claim 6 wherein the memory line further comprises:
   a metal core;
   a memory line barrier layer positioned between the metal core and the programmable layer; and
   wherein the programmable layer comprises hafnium oxide and the memory line barrier layer comprises titanium nitride.

8. An integrated circuit with a programmable electrical connection comprising:
   a memory line comprising a left side and a right side, and wherein the left side and the right side comprise a programmable layer;
   an interlayer dielectric positioned over the memory line; and
   an extending member extending through the interlayer dielectric to a position adjacent to the memory line, wherein the extending member forms an electrical connection with the programmable layer at one of the left side or the right side.

9. The integrated circuit of claim 8 further comprising an inactive area positioned under the memory line and the extending member at the electrical connection between the memory line and the extending member, wherein the inactive area comprises an insulator.

10. The integrated circuit of claim 8 wherein the memory line comprises a metal core and a memory line barrier layer, wherein the memory line barrier layer is positioned between the metal core and the programmable layer, and wherein the programmable layer comprises hafnium oxide and the memory line barrier layer comprises titanium nitride.

11. The integrated circuit of claim 10 wherein the extending member comprises:
   an adhesion layer comprising titanium;
   an extending member barrier layer comprising titanium nitride; and
   a plug comprising tungsten, wherein the extending member barrier layer is positioned between the adhesion layer and the plug.

12. The integrated circuit of claim 8 further comprising sidewall spacers abutting the left side and the right side, and wherein the extending member extends through the sidewall spacers to form the electrical connection with the programmable layer.

13. The integrated circuit of claim 8 further comprising:
   a sense amplifier;
   a program/sense selector; and
   wherein the memory line is electrically connected to the sense amplifier and the program/sense selector.

14. The integrated circuit of claim 13 further comprising:
   a wordline;
   a bitline voltage supply;
   an access transistor, wherein the access transistor further comprises an access transistor gate, a power input, and an output to memory cell; and
   wherein the access transistor gate is electrically connected to the wordline, the power input is electrically connected to the bitline voltage supply, and the output to memory cell is electrically connected to the extending member.

* * * * *